(12) United States Patent
Chen et al.

(10) Patent No.: US 7,662,665 B2
(45) Date of Patent: Feb. 16, 2010

(54) METHOD FOR FABRICATING A SEMICONDUCTOR PACKAGE INCLUDING STRESS RELIEVING LAYER FOR FLIP CHIP PACKAGING

(75) Inventors: Chen-Shien Chen, Hsinchu (TW); Kuo-Chin Chang, Hsinchu (TW); Szu-Wei Lu, Hsinchu (TW); Pei-Haw Tsao, Taichung (TW); Chung-Yu Wang, Hsinchu (TW); Han-Liang Tseng, Hsinchu (TW); Mirng-Ji Lii, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 112 days.

(21) Appl. No.: 11/655,844

(22) Filed: Jan. 22, 2007

(65) Prior Publication Data

US 2008/0174002 A1    Jul. 24, 2008

(51) Int. Cl.
   *H01L 21/00*    (2006.01)
(52) U.S. Cl. .............. 438/108; 438/455; 257/E21.511
(58) Field of Classification Search .............. 438/108, 438/455–459, 977, 672, 675, 109; 257/690, 257/778, E23.023, E21.001, E21.511, 686
   See application file for complete search history.

(56) References Cited

U.S. PATENT DOCUMENTS

| | | | | |
|---|---|---|---|---|
| 6,081,429 A | * | 6/2000 | Barrett | ........................ 361/767 |
| 6,943,442 B2 | * | 9/2005 | Sunohara et al. | ............ 257/700 |
| 6,982,380 B2 | * | 1/2006 | Hoffmann et al. | ........... 174/520 |
| 7,235,889 B2 | * | 6/2007 | Othieno et al. | .............. 257/796 |
| 2003/0168256 A1 | | 9/2003 | Chien | |

\* cited by examiner

*Primary Examiner*—Khiem D Nguyen
(74) *Attorney, Agent, or Firm*—Birch, Stewart, Kolasch & Birch, LLP

(57) ABSTRACT

A method for fabricating a semiconductor package is provided. In one embodiment, a semiconductor chip having a plurality of exposed conductive layers thereon is provided. A first substrate having a first surface and a second surface is provided, the first surface having a plurality of exposed via plugs thereunder. The semiconductor chip is bonded to the first substrate, wherein the plurality of exposed conductor layers are aligned and in contact with the surfaces of the exposed via plugs. A portion of the second surface of the first substrate is then removed to expose the opposite ends of the plurality of via plugs. A plurality of UBM layers is formed on the surfaces of the opposite ends of the plurality of via plugs. A plurality of solder bumps is formed and mounted on the UBM layers. A second substrate having a first surface and a second surface is provided, the solder bumps being mounted to the first surface of the second substrate. A plurality of solder balls is formed and mounted to the second surface of the second substrate. A third substrate is mounted to the solder balls.

19 Claims, 4 Drawing Sheets

METHOD FOR FABRICATING A SEMICONDUCTOR PACKAGE INCLUDING STRESS RELIEVING LAYER FOR FLIP CHIP PACKAGING

BACKGROUND

The present invention relates generally to the fabrication of semiconductor chip packages, and more particularly, to ball grid array (BGA) packages having reduced warpage and enhanced structural strength.

Ball grid array is an advanced type of integrated circuit packaging technology which is characterized by the use of a substrate whose upper surface is mounted with a semiconductor chip and whose lower surface is mounted with a grid array of solder balls. During a surface mount technology process, for example, the BGA package can be mechanically bonded and electrically coupled to a printed circuit board (PCB) by means of these solder balls.

Flip chip ball grid array is a more advanced type of BGA technology that uses flip chip technology in mounting the active side of the chip in an upside-down manner over the substrate and bonded to the same by means of a plurality of solder bumps attached to input/output pads thereon. FIG. 1 shows a cross-sectional view of a conventional semi-finished flip chip package. Flip chip package 2 includes a chip 4 having an upper surface 6 and a lower surface 8 opposite the upper surface 6. A set of solder bumps 10 is connected to contact pads (not shown) on the lower surface 8 of chip 4. Chip 4 is secured to a substrate 12 underlying chip 4. Solder bumps 10 are attached to contact pads (not shown) on an upper surface of substrate 12. An underfill 14 may be filled between chip 4 and substrate 12 to stiffen the flip chip package 2 and protect chip 4 from flexural damage. A set of solder balls 16 may be secured to contact pads (not shown) on a lower surface of substrate 12. Solder balls 16 may also be secured to contact pads (not shown) on a printed circuit board (PCB) substrate 18.

The flip chip package 2 may also include a heat spreader 20 and stiffener 22 for preventing excess warpage of the package and heat dissipation. Heat spreader 20 is mounted on top of chip 4 to dissipate heat generated by chip 4 and to counterbalance the forces exerted by the thermal expansion mismatches between at least the chip 4 and the substrate 12. The conventional flip chip package 2 may also include a thermal interface material (TIM) 26 disposed between chip 4 and heat spreader 20 for transferring the heat generated by chip 4 to heat spreader 20.

The chip 4 and substrate 12 are usually formed of different materials having mismatched coefficients of thermal expansion (CTE). As a result, the chip 4 and substrate 12 experience significantly different dimensional changes during thermal and mechanical stress cycles that create significant thermally-induced stresses in the electrical connections between the chip and the substrate. These high thermal stresses and warpage not only lead to delamination in the low-k dielectric layers in the chip 4, but also cause solder bump cracks leading to failure, thereby degrading the long term operating reliability of the flip chip BGA package. Although stiffeners and heat spreaders limit warpage to a certain degree, they do not entirely eliminate the problem.

As the trend in the industry is to use extreme low dielectric constant (ELK) materials for the dielectric layers in the next generation of interconnect structures, such as semiconductor chips, the ELK films being weaker and less dense than ordinary low-k dielectric films, the effect of a mismatch in the CTE between the chip and the substrate becomes even more pronounced.

For these reasons and other reasons that will become apparent upon reading the following detailed description, there is a need for an improved BGA package that addresses the above-discussed issues.

SUMMARY

The present invention is directed to a method for fabricating a semiconductor package. In one embodiment, a semiconductor chip having a plurality of exposed conductive layers thereon is provided. A first substrate having a first surface and a second surface is provided, the first surface having a plurality of exposed via plugs thereunder. The semiconductor chip is bonded to the first substrate, wherein the plurality of exposed conductor layers are aligned and in contact with the surfaces of the exposed via plugs. A portion of the second surface of the first substrate is then removed to expose the opposite ends of the plurality of via plugs. A plurality of UBM layers is formed on the surfaces of the opposite ends of the plurality of via plugs. A plurality of solder bumps is formed and mounted on the UBM layers. A second substrate having a first surface and a second surface is provided, the solder bumps being mounted to the first surface of the second substrate. A plurality of solder balls is formed and mounted to the second surface of the second substrate. A third substrate is mounted to the solder balls.

BRIEF DESCRIPTION OF THE DRAWINGS

The features, aspects, and advantages of the present invention will become more fully apparent from the following detailed description, appended claims, and accompanying drawings in which:

DETAILED DESCRIPTION

In the following description, numerous specific details are set forth to provide a thorough understanding of the present invention. However, one having an ordinary skill in the art will recognize that the invention can be practiced without these specific details. In some instances, well-known structures and processes have not been described in detail to avoid unnecessarily obscuring the present invention.

Figure 1:
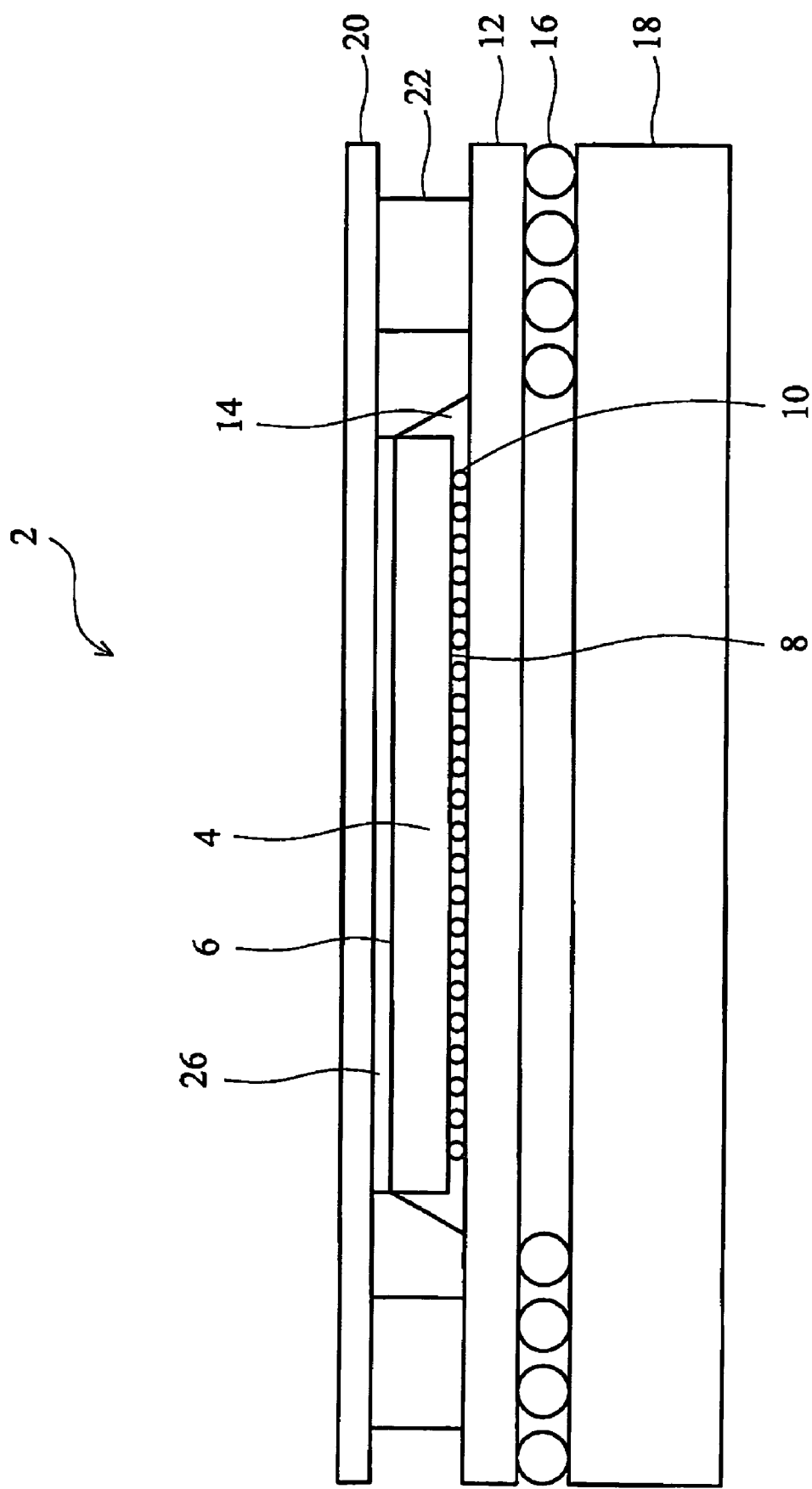
FIG. 1 is a cross-sectional view of a conventional semi-finished flip chip package.
Figure 2:
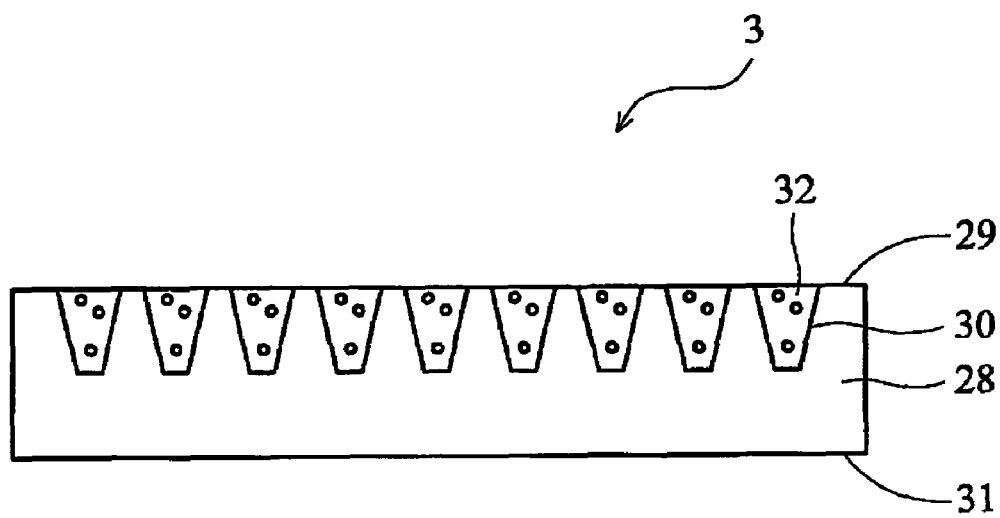
FIG. 2 is a cross-sectional view of a semi-finished flip chip package showing a first substrate having a first surface and a second surface, the first substrate having through wafer vias with a conductive material formed therein to form exposed via plugs according to one embodiment of the present invention.

Referring initially to FIG. 2, a cross-sectional view of a semi-finished flip chip package 3 showing a first substrate 28 having a first surface 29 and a second surface 31 is shown, the first substrate 28 having a plurality of through wafer vias 30 with a conductive material formed therein to form exposed via plugs 32 according to one embodiment of the present invention. First substrate 28 is a stress relieving substrate comprising silicon (Si), silicon dioxide ($SiO_2$), glass, or combinations thereof and functions to share the stress imposed on the flip chip package 3 during thermal and mechanical cyclings and also to enhance solder bump support in the flip chip package. Use of first substrate 28 for stress relief is particularly advantage in flip chip packages that use extreme low dielectric constant (ELK) materials for the dielectric layers in semiconductor chips because ELK films are weaker and less dense than ordinary low-k dielectric films and hence they are more prone to delaminations during thermal and mechanical cyclings. In one embodiment of the present invention, first substrate 28 comprises silicon and has a thickness of from about 200 μm to about 775 μm.

A plurality of through wafer vias 30 are formed under the first surface 29 of first substrate 28. Through wafer vias 30 may be formed by conventional photolithographic and etching techniques. In one embodiment of the present invention, the width of the through wafer via 30 may be in the range of from about 40 μm to about 125 μm and the depth may be in the range of from about 50 μm to about 300 μm. A layer of conductive material is deposited overlying the through wafer vias 30 by a conventional plating process. The conductive material layer is formed from any suitable conductive material, such as copper. The plating process continues for a predetermined amount of time or until an endpoint detection apparatus indicates that a desired deposition thickness has been achieved. The deposition process results in the deposition of the conductive material layer such that through wafer vias 30 are completely filled with the conductive material, while the conductive material layer maintains a substantially planar surface.

Following the deposition of the conductive material layer having a relatively thin overburden and a substantially planar upper surface, the excess conductive material layer overlying the upper surface of first substrate 28 may be removed to leave exposed via plugs 32 within through wafer vias 30 as shown in FIG. 2. Removal of the excess conductive material layer may be effected by a chemical mechanical planarization (CMP) process, electrochemical mechanical planarization (ECMP), wet etching, or any other suitable conventional removal method.

Figure 3:
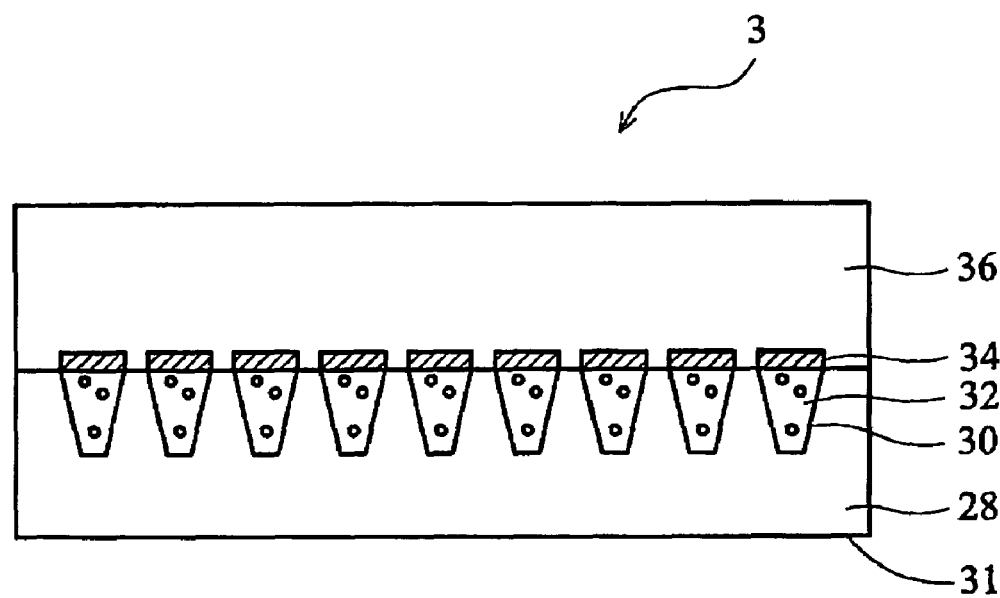
FIG. 3 is a cross-sectional view of the flip chip package of FIG. 2 showing the first substrate bonded to a semiconductor chip having exposed conductive layers thereon, whereby the conductive layers are aligned to and in contact with the surfaces of the exposed via plugs according to one embodiment of the present invention.

Referring now to FIG. 3, a cross-sectional view of the flip chip package 3 of FIG. 2 is shown where the first substrate 28 is bonded to a semiconductor chip 36 having exposed top conductive layers 34 thereon, whereby the conductive layers 34 are aligned to and in contact with the surfaces of the exposed via plugs 32 according to one embodiment of the present invention. Semiconductor chip 36 has a substrate that has formed thereupon any of several microelectronic layers as are conventionally employed within semiconductor fabrication. These layers may include, for example, conductor layers, semiconductor layers, dielectric layers, active and passive devices (all not shown). The dielectric layer may be silicon oxide, silicon nitride, silicon oxynitride, low-k dielectric materials, high-k dielectric materials, or combinations thereof. In one embodiment of the invention, the dielectric layers include extreme low dielectric constant (ELK) films. As used herein, low dielectric constant materials are those films having a dielectric constant between 3.0 to 2.5 and extreme low dielectric constant films are those films having a dielectric constant below 2.5 extending to dielectric constants below 2.0. The ELK film may include any ELK film including but not limited to inorganic, organic, and hybrid dielectric materials and their respective porous versions. It is understood that the type of the substrate is a design choice dependent on the fabrication process being employed.

Semiconductor chip 36 has a plurality of exposed top conductor layers 34, which may be either the metal layers or the bond pads of chip 36. Top conductor layers 34 establish electrical contact between chip 36 and a later to be formed plurality of overlying solder bumps. Semiconductor chip 36 is bonded to first substrate 28 by having the exposed top conductor layers 34 on chip 36 aligned with and made contact to the exposed via plugs of first substrate 28. This procedure may be accomplished by using conventional aligned wafer bonding to bond semiconductor chip 36 to first substrate 28 as well as other conventional bonding techniques such as, direct bond, anodic bond, eutetic bond, adhesive bond, or glass frit bond.

Figure 4:
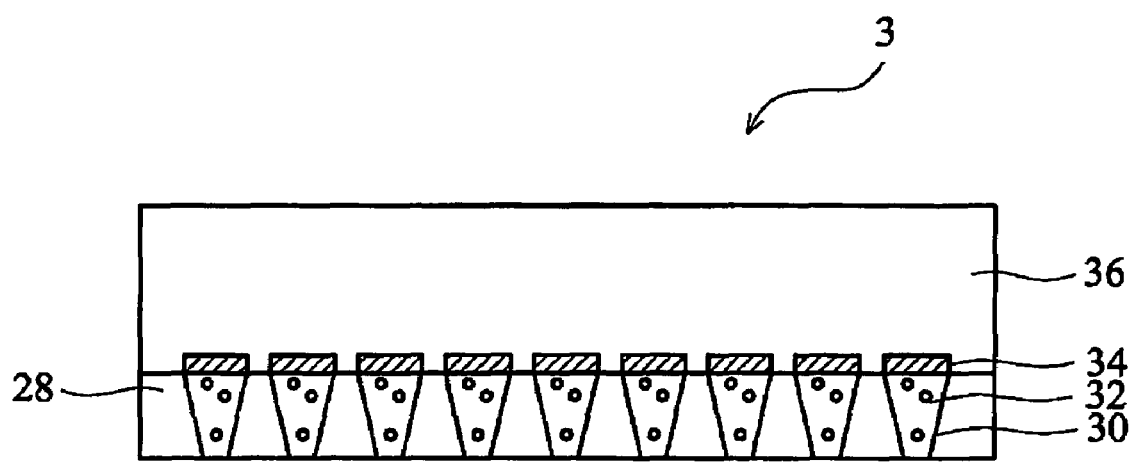
FIG. 4 is a cross-sectional view of the flip chip package of FIG. 3 showing a portion of the second surface of the first substrate removed to expose the opposite ends of the via plugs according to one embodiment of the present invention.

FIG. 4 is a cross-sectional view of the flip chip package 3 of FIG. 3 showing a portion of the second surface 31 of the first substrate 28 removed to expose the opposite ends of the via plugs 32 according to one embodiment of the present invention. Second surface 31 of first substrate 28 may be ground, polished, or thinned using any suitable conventional methods, such as mechanical grinding, wet or dry etching, CMP, EMCP, and the like, or a combination of such methods to expose via plugs 32 within through wafer vias 30. First substrate 28 may be polished to any suitable thickness. In one embodiment of the present invention, first substrate 28 is polished to a thickness of from about 50 μm to about 300 μm. In another embodiment, first substrate 28 has a thickness of about 150 μm.

Figure 5:
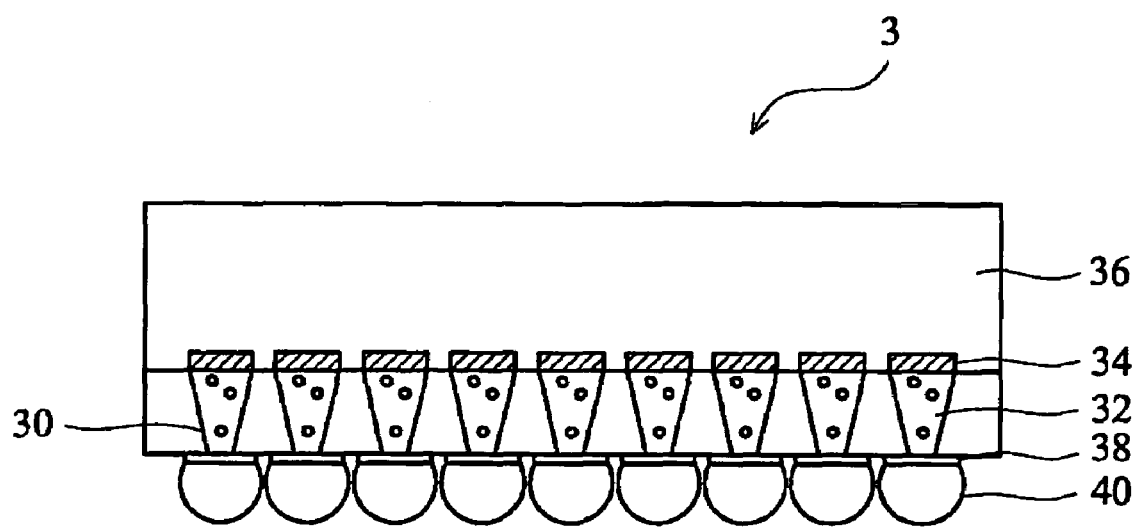
FIG. 5 is a cross-sectional view of the flip chip package of FIG. 4 showing the formation of a plurality of UBM layers on the surfaces of the opposite ends of the via plugs and the formation of a plurality of solder bumps on the UBM layers according to one embodiment of the present invention.

FIG. 5 shows a cross-sectional view of the flip chip package 3 of FIG. 4 showing the formation of a plurality of UBM layers 38 on the surfaces of the opposite ends of the via plugs 32 and the formation of a plurality of solder bumps 40 on the UBM layers 38 according to one embodiment of the present invention. UBM layers 38 may be composed of a plurality of individual layers of a variety of different metals (e.g. adhesion layer, barrier layer, and wettable layer) and may be formed and deposited on the surfaces of the opposite ends of via plugs 32 by any of a variety of methods including electroless plating, sputtering, or electroplating. Following formation of UBM layers 38, solder bumps 40 are then formed and mounted on UBM layers 38 by conventional techniques.

Figure 6:
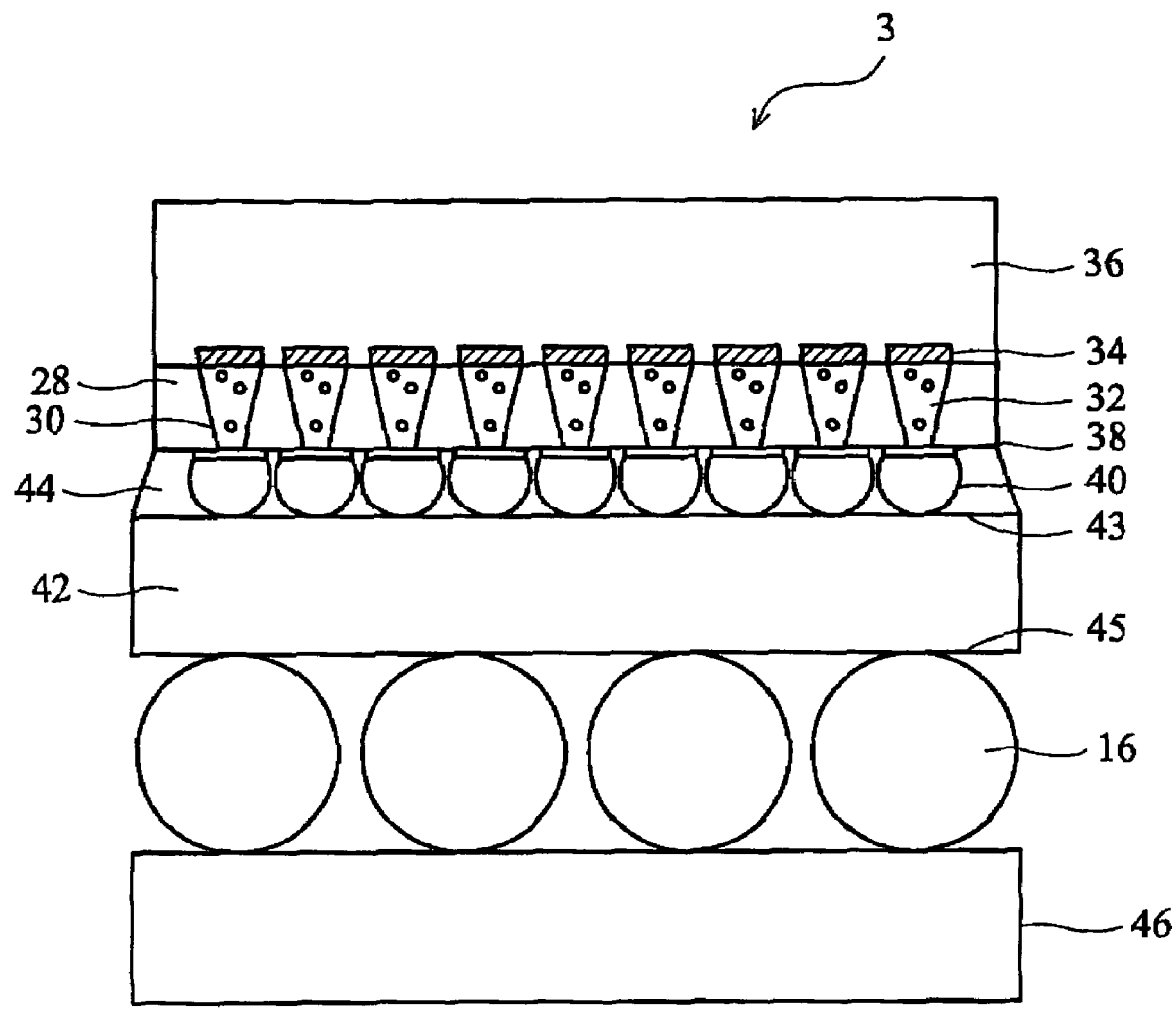
FIG. 6 is a cross-sectional view of the flip chip package of FIG. 5 showing a second substrate having first and second surfaces, the solder bumps mounted to the first surface of the second substrate; a plurality of solder balls mounted to the second surface of the second substrate; and a third substrate mounted to the solder balls according to one embodiment of the present invention.

FIG. 6 is a cross-sectional view of the flip chip package 3 of FIG. 5 showing a second substrate 42 having a first surface 43 and a second surface 45, the solder bumps 40 mounted to the first surface 43 of the second substrate 42; a plurality of solder balls 16 mounted to the second surface 45 of the second substrate 42; and a third substrate 46 mounted to the solder balls 16 according to one embodiment of the present invention. The solder bumps 40 are attached to contact pads (not shown) on the first surface 43 of second substrate 42. An underfill 44 may be filled between first substrate 28 and second substrate 42 to stiffen the flip chip package 3 and protect flip chip package 3 from flexural damage. A set of solder balls 16 may be secured to contact pads (not shown) on the second surface 45 of second substrate 42. The solder balls 16 may also be secured to contact pads (not shown) on third substrate 46. The third substrate 46 may be a printed wire board (also sometimes called a printed circuit board) or may be a multilayer module known to those skilled in the art.

In accordance with aspects of the present invention, the insertion of the stress relieving-silicon-comprising substrate between the semiconductor chip with ELK dielectric layers and the second substrate achieves at least two advantages: 1) because ELK films contained in chips are more prone to delaminations as they are weaker and less dense than ordinary low-k dielectric films, the silicon-comprising substrate inserted between the chip and the second substrate acts to relieve the stress imposed on the flip chip package during thermal and mechanical cyclings thereby resulting in a more robust flip chip package; and 2) because the solder bumps are not formed on the chip and therefore on the weaker ELK films, but instead on the stress-relieving-silicon-comprising substrate, the solder bumps are more robust and consequently solder bump crackings are significantly reduced.

In the preceding detailed description, the present invention is described with reference to specifically exemplary embodiments thereof. It will, however, be evident that various modifications, structures, processes, and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method for fabricating a semiconductor package, comprising:
   providing a semiconductor chip comprising a dielectric layer therein having a plurality of exposed conductive layers thereon;
   providing a first dielectric substrate having a first surface and a second surface, the first surface having a plurality of exposed via plugs thereunder, wherein no solder bump formed between the semiconductor chip and the first dielectric substrate, wherein the dielectric layer in the semiconductor chip and the first dielectric substrate have different dielectric constants from each other;
   bonding the semiconductor chip to the first substrate, wherein the plurality of exposed conductor layers are aligned and in contact with the surfaces of the exposed via plugs;
   removing a portion of the second surface of the first substrate to expose the opposite ends of the plurality of via plugs;
   forming a plurality of UBM layers on the surfaces of the opposite ends of the plurality of via plugs;
   forming a plurality of solder bumps mounted on the UBM layers; and
   providing a second substrate having a first surface and a second surface, the solder bumps mounted to the first surface of the second substrate.

2. The method of fabricating a semiconductor package of claim 1, wherein the conductive layers comprise bond pads or metal layers.

3. The method of fabricating a semiconductor package of claim 1, wherein the first substrate is silicon (Si), silicon oxide (SiO$_2$), glass, or a combination thereof and has a thickness of from about 200 μm to about 775 μm.

4. The method of fabricating a semiconductor package of claim 1, wherein the semiconductor chip is bonded to the first substrate by one of direct bond, anodic bond, eutetic bond, adhesive bond or glass fit bond.

5. The method of fabricating a semiconductor package of claim 1, wherein a portion of the second surface is removed by one of grinding, CMP, EMCP, or wet or dry etching.

6. The method of fabricating a semiconductor package of claim 1, wherein after the step of removing a portion of the second surface of the first substrate, the first substrate has a thickness of from about 50 μm to about 300 μm.

7. The method of fabricating a semiconductor package of claim 1, further comprising dispensing an underfill material in the gap between the first substrate and the second substrate.

8. The method of fabricating a semiconductor package of claim 1, further comprising forming a plurality of solder balls mounted to the second surface of the second substrate.

9. The method of fabricating a semiconductor package of claim 1, further comprising mounting a third substrate to the solder balls.

10. A method for fabricating a semiconductor package, comprising:
    providing a semiconductor chip comprising a dielectric layer therein having a plurality of exposed conductive layers thereon;
    providing a first dielectric substrate having a first surface and a second surface, wherein no solder bump formed between the semiconductor chip and the first dielectric substrate, wherein the dielectric layer in the semiconductor chip and the first dielectric substrate have different dielectric constants from each other;
    forming a plurality of through wafer vias under the first surface of the first substrate;
    filling the through wafer vias with a conductive material to form via plugs;
    bonding the semiconductor chip to the first substrate, wherein the plurality of exposed conductor layers are aligned and in contact with the via plugs;
    removing a portion of the second surface of the first substrate to expose the opposite ends of the via plugs;
    forming a plurality of UBM layers on the surfaces of the opposite ends of the via plugs;
    forming a plurality of solder bumps mounted on the UBM layers; and
    providing a second substrate having a first surface and a second surface, the solder bumps mounted to the first surface of the second substrate.

11. The method of fabricating a semiconductor package of claim 10, wherein the conductive layers comprise bond pads or metal layers.

12. The method of fabricating a semiconductor package of claim 10, wherein the first substrate is silicon (Si), silicon oxide (SiO$_2$), glass, or a combination thereof and has a thickness of from about 200 μm to about 775 μm.

13. The method of fabricating a semiconductor package of claim 10, wherein the semiconductor chip is bonded to the first substrate by one of direct bond, anodic bond, eutetic bond, adhesive bond or glass fit bond.

14. The method of fabricating a semiconductor package of claim 10, wherein the conductive material fills the through wafer vias by one of electroplating and electroless plating the through wafer vias.

15. The method of fabricating a semiconductor package of claim 10, wherein a portion of the second surface of the first substrate is removed by one of grinding, CMP, EMCP, or wet or dry etching.

16. The method of fabricating a semiconductor package of claim 10, wherein after the step of removing a portion of the second surface of the first substrate, the first substrate has a thickness of from about 50 μm to about 300 μm.

17. The method of fabricating a semiconductor package of claim 10, further comprising dispensing an underfill material in the gap between the first substrate and the second substrate.

18. The method of fabricating a semiconductor package of claim 10, further comprising forming a plurality of solder balls mounted to the second surface of the second substrate.

19. The method of fabricating a semiconductor package of claim 10, further comprising mounting a third substrate to the solder balls.

* * * * *